United States Patent [19]

Lee

[11] Patent Number: 5,536,381

[45] Date of Patent: Jul. 16, 1996

[54] SPUTTERING DEVICE

[75] Inventor: Jae-ho Lee, Anyang, Rep. of Korea

[73] Assignee: Samsung Electronics Co., Ltd., Suwon, Rep. of Korea

[21] Appl. No.: 359,658

[22] Filed: Dec. 20, 1994

[30] Foreign Application Priority Data

Jun. 29, 1994 [KR] Rep. of Korea .................. 94-15228

[51] Int. Cl.⁶ .................................................. C23C 4/34
[52] U.S. Cl. ............................................... 204/298.11
[58] Field of Search ....................................... 204/298.11

[56] References Cited

U.S. PATENT DOCUMENTS

| 5,223,108 | 6/1993 | Hurwitt | 204/192.12 |
| 5,393,398 | 2/1995 | Sugano | 204/298.11 |

FOREIGN PATENT DOCUMENTS

| 61-577 | 1/1986 | Japan | 204/298.11 |
| 63-310965 | 12/1988 | Japan | 204/298.11 |
| 5-311419 | 11/1993 | Japan | 204/298.11 |

*Primary Examiner*—Aaron Weisstuch
*Attorney, Agent, or Firm*—Rothwell, Figg, Ernst & Kurz

[57] ABSTRACT

A sputtering device for improving adhesion of a deposited film by attaching a grating set to a shield is provided. The sputtering device comprises a sputtering chamber, a first electrode which supports a substrate and is used as an electrode within the sputtering chamber, a target composed of a source material to be sputtered toward the first electrode, a second electrode attached to the target, a shield which is insulated from the second electrode and attached beneath the target, and a grating set which is attached to the shield, for changing the paths of the sputtered particles. The path of particles moving near the shield during sputtering, e.g., sputtered particles or neutralized plasma ions, is changed into a vertical direction with respect to the substrate via the grating set. As a result, the film formed over the whole surface of the substrate has a compressive stress, thereby improving the adhesion.

3 Claims, 2 Drawing Sheets

SPUTTERING DEVICE

BACKGROUND OF THE INVENTION

The present invention relates to a sputtering device, and more particularly, to a sputtering device which improves the adhesion of film to be deposited by introducing a pair of gratings to a shield.

A sputtering device makes high energy particles collide with a predetermined substance, e.g., the surface of a target. As a result, atoms of the target are ejected whereby a film is grown on a substrate. The sputtering device is widely used for depositing various metal films on the substrate during VLSI manufacturing processes. Also, the sputtering device can be used for forming an insulating layer or a refractory metal layer, which is formed by a general chemical vapor deposition method.

FIG.1 is a diagram schematically showing an apparatus for sputtering according to a conventional art.

First, the major constituent elements of the device will be explained via reference numerals. Reference numerals 1, 2, 4, and 6 represent the chamber of the sputtering device, a first electrode (anode) which supports the substrate (wafer) and is used as an electrode, a silicon substrate on which a film is to be formed, and a revolving shaft for revolving a chuck used as the first electrode, respectively. Also, reference numerals 8, 10, 12, and 20 represent a target composed of a source material to be sputtered, a second electrode (cathode) attached to the target, a shield portion located below the target, and a power supply, respectively.

Next, a process of forming a film on the substrate (wafer) using the conventional sputtering device will be explained.

An inert gas, e.g., argon, is injected into the vacuum chamber 1 having high-voltage electrodes 2 and 10, whereby the argon gas is formed into a plasma state 14, that contains argon ions (Ar+) 16. These plasma ions 16 are accelerated onto target 8 mounted on an oppositely charged electrode 10, that is, negatively charged, by an electric field and collide with target 8. By colliding with target 8, the plasma ions 16 eject the source material from target 8. Also, plasma ions 16 are neutralized and continuously move toward the lower positioned substrate 4. The ejected particles of source material move toward the semiconductor substrate 4, thereby forming a film having a predetermined thickness o substrate 4.

Especially, particles moving near shield portion 12 during sputtering, e.g., sputtered particles or neutralized plasma ions 16, move toward the lower positioned substrate 4 according to a path 15 having a slight angle. When the particles (shown by arrow 18) moving at the slight angle become spread out near the edge portion of the substrate, a tensile stress is generated in the thus-coated film, thereby decreasing adhesion.

SUMMARY OF THE INVENTION

It is an object of the present invention to provide a sputtering device for improving film adhesion throughout a substrate's surface, including the edges thereof.

To accomplish the above object, the sputtering device according to the present invention comprises: a sputtering chamber; a first electrode which supports a substrate and is used as an electrode within the sputtering chamber; a target composed of a source material to be sputtered towards the first electrode; a second electrode attached to the target; a shield which is insulated from the second electrode and attached beneath the target; and a grating set which is attached to the shield, for changing the path of the sputtered particles.

The grating set is composed of a first grating having a plurality of concentric rings surrounding a processing region of the sputtered particles and a second grating which is radially arranged with respect to the center of the processing region of the sputtered particles. Also, it is desirable that the grating set is made of a metal. However, another material can be used for manufacturing the grating set.

Also, in the above grating set composed of the first grating and second grating, when the two grating are combined, a grating pattern having a crossing angle of 30°–90° is generated.

According to the present invention, the path of particles moving near the shield during sputtering, e.g., sputtered particles or neutralized plasma ions, is changed into a direction vertical to the substrate via the grating set. As a result, the film formed over the whole surface of the substrate exhibits a compressive stress, thereby improving adhesion.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Referring to the appended drawings, a preferred embodiment of the present invention will be described in detail.

Figure 1:
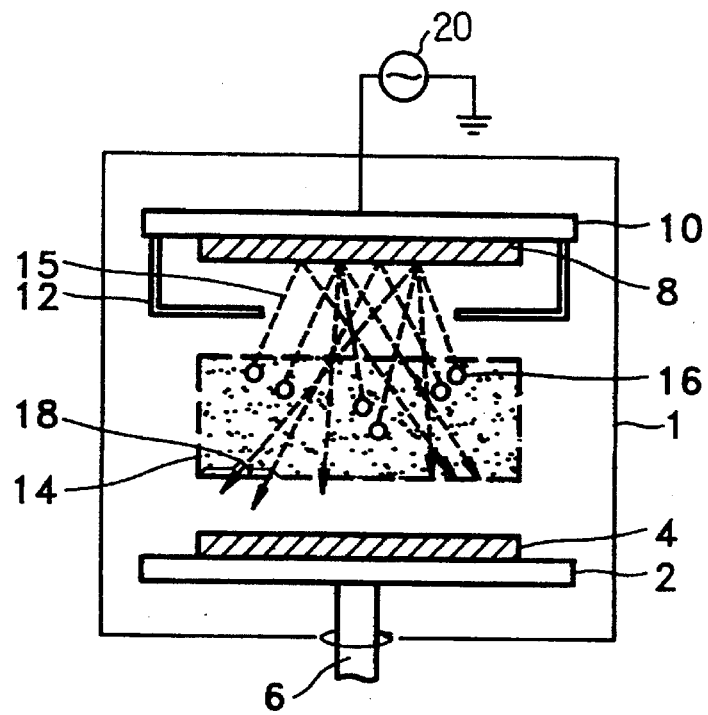
FIG. 1 is a diagram schematically showing a sputtering device according to the conventional art.
Figure 2:
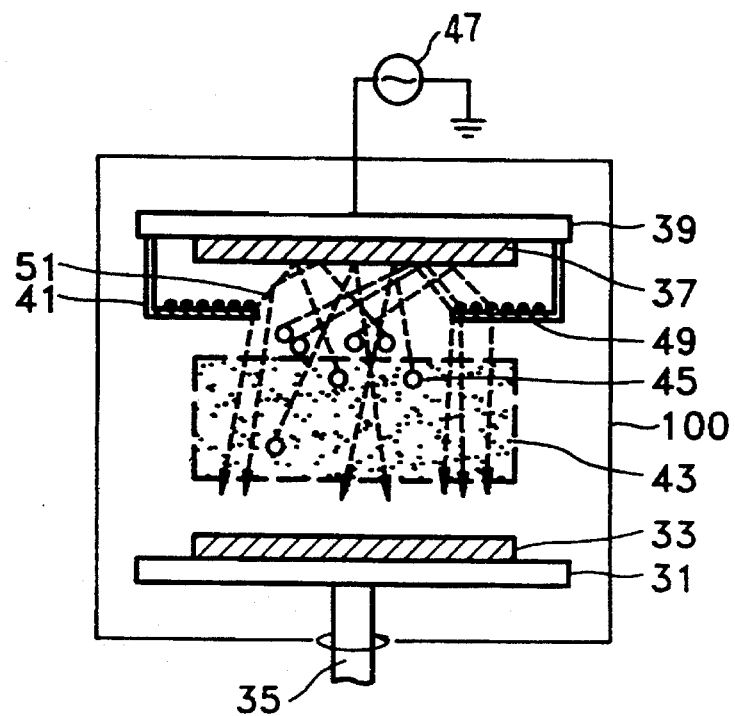
FIG. 2 is a diagram schematically showing a sputtering device according to the present invention.

FIG. 2 is a diagram schematically showing a sputtering device according to the present invention.

First, the major constituents of the device will be explained via reference numerals. Reference numeral 100 represents the chamber of the sputtering device. Reference numerals 31, 33, and 35 represent a first electrode (anode) which supports the substrate (wafer) and is used as an electrode, a silicon substrate on which a film is formed, and a revolving shaft for revolving a chuck used as the first electrode, respectively. Also, reference numerals 37, 39, and 47 represent a target composed of a source material to be sputtered, a second electrode (cathode) attached to the target, a shield which is attached to the first electrode and located below the target, and a power supply, respectively. Reference numeral 49 represents a grating set attached to shield 41.

Next, a process of forming a film on the substrate (wafer) using a sputtering device according to the present invention will be explained.

An inert gas, e.g., argon, is injected into the vacuum chamber having high-voltage electrodes 31 and 39, whereby the argon gas is formed into a plasma state 43, that is, containing argon ions (Ar+) 45. These plasma ions 45 are accelerated onto target 37 mounted on an oppositely charged electrode 39, that is, negatively charged, by an electric field and collide with target 37. By colliding with target 37, the plasma ions 45 eject the source material from target 37. Also, plasma ions 45 are neutralized and continuously move toward the lower positioned substrate 33. The ejected particles of source material move toward the substrate 33, thereby forming a film having a predetermined thickness on substrate 33.

According to the present invention, particles moving near shield portion 41 during sputtering, e.g., sputtered particles or neutralized plasma ions 45, are scattered when passing the grating set and particle path 51 is made vertical with respect to the substrate, thereby towards the lower positioned substrate 33. When these particles moving in a vertical direction are spread out on the whole surface of the substrate, a compressive stress is generated over the whole surface of the film by an atomic peening phenomenon, thereby preventing the decreasing of the adhesion effect.

Figure 3:
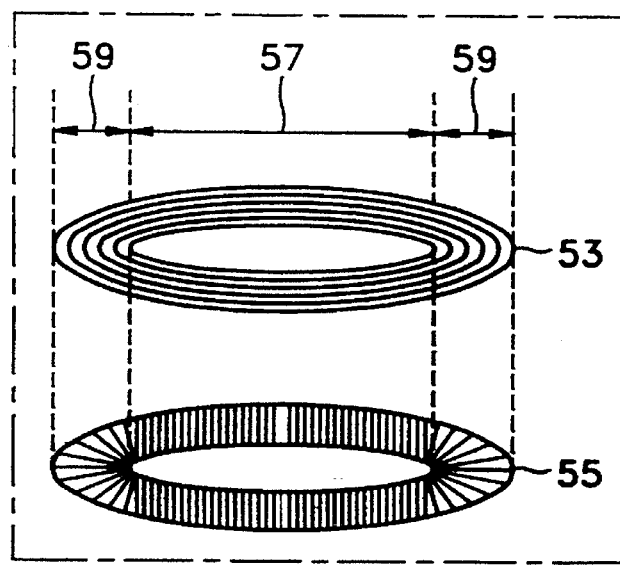
FIG. 3 is an enlarged diagram of a grating set shown in FIG. 2.
Figure 4A:
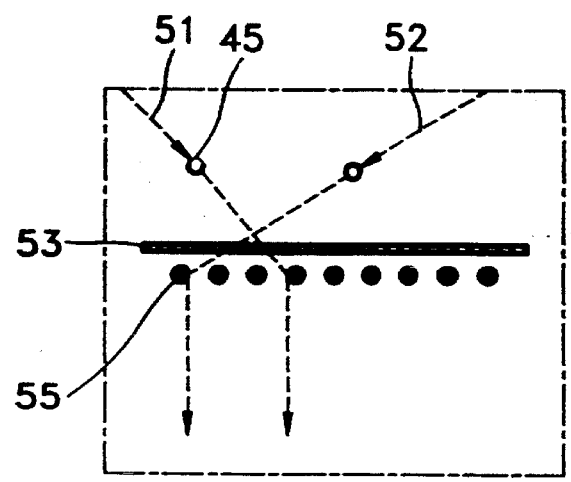
FIGS. 4A and 4B are enlarged cross-sectional diagrams of the central portion and both side portions in FIG. 3, respectively.
Figure 4B:
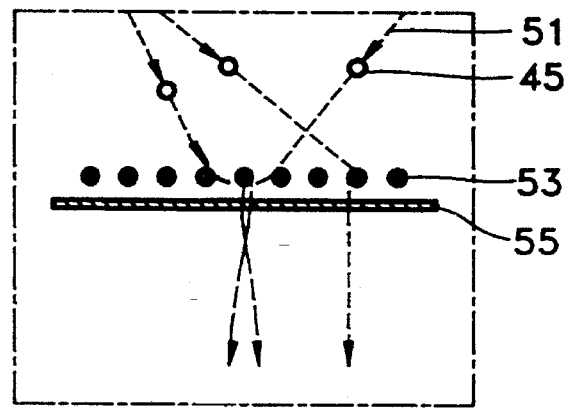

Referring to FIGS. 3, 4A and 4B, the mechanism by which the paths of moving particles are changed by the grating set shown in FIG. 2 is explained.

FIG. 3 is an enlarged diagram of the grating set shown in FIG. 2.

In FIG. 3, reference numeral 53 represents a first grating set having a plurality of concentric rings surrounding a processing region of the sputtered particles, and reference numeral 55 represents a second grating which is radially arranged from the center of the processing region of the sputtered particles. First grating 53 and second grating 55 are combined to thereby form the grating set. Also, reference numeral 57 represents the central portion of the grating set, and reference numeral 59 represents both edge portions of the grating set.

The first and second gratings are positioned with a predetermined spacing therebetween, thereby composing the grating set (reference numeral 49 of FIG. 2) which is made of a metal. Viewing the grating set from the top, we can see a square grating pattern or the teeth of a comb. Also, when the first and second gratings 53 and 55 are combined with each other, each grating is crossed, to become a grating pattern having a crossing angle of 30°–90°.

FIGS. 4A and 4B are enlarged diagram of cross-sections of the central portion 57 and both side portions 59 in FIG. 3, respectively. Here, like components, similar to those shown in FIG. 3, are denoted by the same reference designations.

First, referring to FIG. 4A for explaining the path 51 of particles in the central portion of a grating set 49, particles moving near the shield 41, e.g., particles passing through the first grating 53 without collision with sputtered particles or neutralized plasma ions 45, collide with second grating 55 as shown in FIG. 4A, whereby path 51 is changed into a vertical direction with respect to the substrate. As a result, the particles move toward the lower positioned substrate 33. Also, in the case where the particles whose path is as indicated by reference numeral 52 are incident to the grating set, the particles collide twice and their path is changed into a vertical direction with respect to substrate 33. As a result, the particles move toward the substrate 33.

Referring to FIG. 4B for explaining path 51 of particles in both side portions of grating set 49, particles moving near the shield 41, e.g., sputtered particles or neutralized plasma ions 45, collide with first grating 53, whereby the path is changed into a vertical direction with respect to substrate 33. Thereafter, the particles pass through second grating 55, as shown in FIG. 4B, and move in a vertical direction with respect to the substrate.

According to the present invention, the path of particles moving near shield 41 during sputtering, e.g., sputtered particles or neutralized plasma ions 45, is changed into a vertical direction with respect to substrate 33 via the grating set. As a result, a film formed over the whole surface of the substrate exhibits a compressive stress, thereby improving adhesion.

The present invention is not limited to the preferred embodiment and various modifications are possible within the limits of the technology of the present invention, as understood by one skilled in the art.

What is claimed is:

1. A sputtering device comprising:

a sputtering chamber;

a first electrode which supports a substrate and is used as an electrode within said sputtering chamber;

a target composed of a source material to be sputtered towards the first electrode;

a second electrode attached to the target;

a shield which is insulated from the second electrode and attached beneath said target; and a grating set which is attached to the shield, for changing the paths of the sputtered particles, said grating set including a first grating having a plurality of rings surrounding a processing region of the sputtered particles and a second grating which is radially arranged with respect to the center of the processing region of the sputtered particles.

2. A sputtering device as set forth in claim 1, wherein said grating set is made of a metal.

3. A sputtering device as set forth in claim 1, wherein a grating pattern having a crossing angle of 30°–90° is generated when said first and second gratings are combined.

\* \* \* \* \*